United States Patent [19]

Coberly et al.

[11] 4,116,523

[45] Sep. 26, 1978

[54] HIGH FREQUENCY PROBE

[75] Inventors: Charles W. Coberly, Pasadena; Howard A. Lewis, Yorba Linda, both of Calif.

[73] Assignee: James M. Foster, El Monte, Calif.

[21] Appl. No.: 651,962

[22] Filed: Jan. 23, 1976

[51] Int. Cl.$^2$ .................. H01R 13/36; G01R 31/02
[52] U.S. Cl. .......................... 339/108 TP; 324/158 P
[58] Field of Search ............ 339/108 TP, 95 R; 324/149, 158 P

[56] References Cited

U.S. PATENT DOCUMENTS

| 3,560,907 | 2/1971 | Heller | 324/158 P |
| 3,611,128 | 10/1971 | Nagata | 324/158 P |
| 3,812,311 | 5/1974 | Kvaternik | 339/108 TP |
| 3,851,249 | 11/1974 | Roch | 324/158 P |

Primary Examiner—Roy Lake
Assistant Examiner—Mark S. Bicks
Attorney, Agent, or Firm—Christie, Parker & Hale

[57] ABSTRACT

A novel high frequency electrical probe comprising:
a blade-like active body member adapted to be supported at one end with its major plane at substantially 90° to a circuit to which contact is to be made;
the other end of said body member formed to have a generally pointed edge to serve as a contact point to be abutted against the circuit;
on both sides of said active body member, elements which are approximately coextensive with said body member, but having either no contact points, or pointed edges which abut said circuit at points slightly displaced from the contact point of said active body member.

7 Claims, 8 Drawing Figures

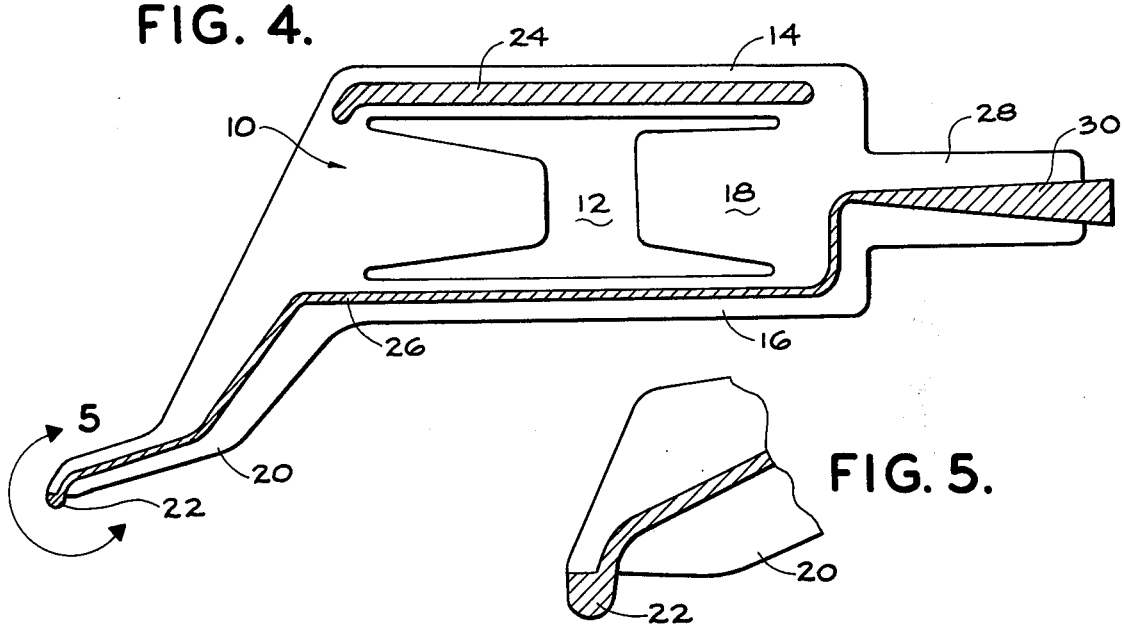
FIG. 4.
FIG. 5.
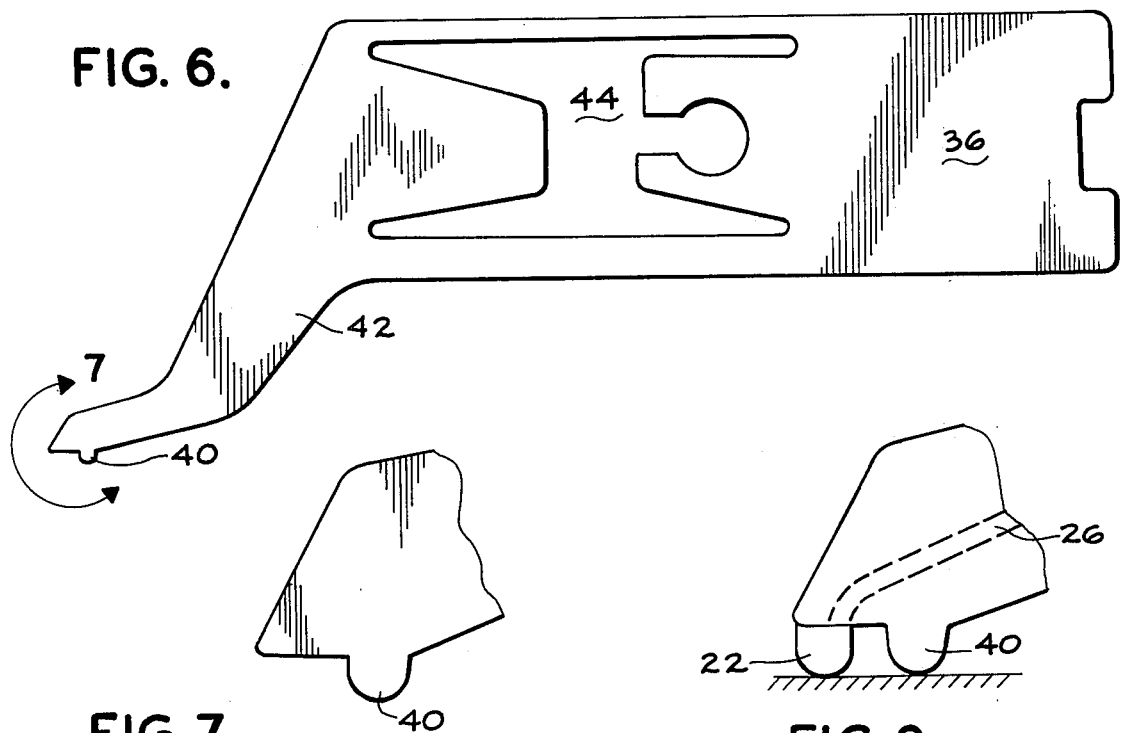
FIG. 6.
FIG. 7.
FIG. 8.

HIGH FREQUENCY PROBE

BACKGROUND OF THE INVENTION

As has been pointed out in U.S. Pat. No. 3,560,907, there is an ever increasing trend toward increasing miniaturization of electrical and electronic circuits, accompanying which is the continuing problem of making effective electrical connections to such circuits without adversely affecting, or possibly destroying, the circuits. This problem becomes especially acute in manufacturing testing where it may be necessary to take circuit readings at a large number of different points, and, of course, leave the circuit unimpaired by the testing.

U.S. Pat. No. 3,560,907 relates to an electrical contact wherein the end of the contact is adapted to be brought into abutment with the circuit under test such that all resilient motion is normal to the circuit, thereby reducing "scrubbing" which can easily destroy deposited circuit elements. The contacts of said patent are quite adequate for numerous applications. However, we have found that a novel contact, hereinafter described, is vastly superior for testing, primarily active testing rather than passive testing, involving high frequencies of the type which are becoming more prevalent in the computer and other arts. This novel contact is believed to represent a major advance in the field and its widespread adoption is to be expected.

In another aspect, stray radio frequencies are oftimes present in proximity to where test contacts or probes are used. It has found that this condition can interfere with or destroy the accuracy of the test. The device of the present invention also solves this problem by the shielding of the contact from external or stray radio frequencies.

SUMMARY OF THE INVENTION

Briefly, this invention comprises:

a blade-like active body member adapted to be supported at one end with its major plane at substantially 90° to a circuit to which contact is to be made;

the other end of said body member formed to have a generally pointed edge to serve as a contact point to be abutted against the circuit;

on both sides of said active body member, elements which are approximately coextensive with said body member but having either no contact points or pointed edges which abut said circuit at points slightly displaced from the contact point of said active body member.

In the preferred embodiment, the novel probe comprises:

a blade-like active body member adapted to be supported at one end with its major plane at substantially 90° to a circuit to which contact is to be made;

the other end of said body member formed to have a generally pointed edge to serve as a contact point to be abutted against the circuit;

on both sides of said active body member, ground contacts which are approximately coextensive with said body member, but having pointed edges which abut said circuit at points slightly displaced from the contact point of said active body member;

the central regions of said blade-like member and said ground contacts having areas of the member material removed forming said member into a double cantilever such that pressure of the pointed ends against the circuit produces translation of said pointed ends substantially 90° to the circuit.

It is an object of this invention to provide a novel electrical probe.

More particularly, it is an object of our invention to provide a novel high frequency probe.

Another object is the provision in a high frequency probe of resilient contacting members which move substantially normally to the general plane of the circuit.

A further object is the provision of low contact pressure high frequency probe to a microminiature circuit at a plurality of precisely located circuit points quickly, easily and without damaging the circuit even during high speed testing.

This and other objects and advantages of this invention will be apparent from the detailed description which follows:

DESCRIPTION OF THE PREFERRED EMBODIMENTS

Turning to the drawings:

FIG. 4 is a side view of the active contact portion of one embodiment of the novel probe of this invention.

FIG. 5 is an enlargement of the contact point of the element of FIG. 4.

FIG. 6 is a side view of the ground contact portion of one embodiment of the novel probe of this invention.

FIG. 7 is an enlargement of the contact point of the element of FIG. 6.

FIG. 8 shows the contact points of FIG. 5 and 7 in their assembled relationship.

Figure 1:
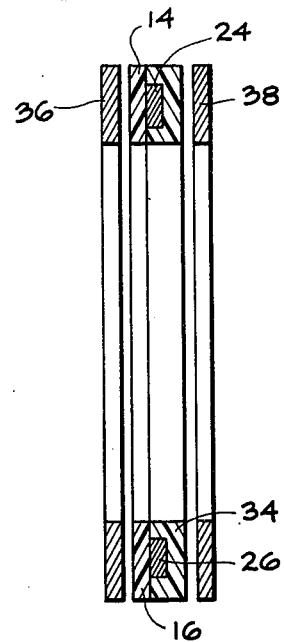
FIG. 1 is a perspective exploded view of one embodiment of this invention.

Turning to the drawings in more detail, the blade-like active body member 10 has a cut-out or opening 12 therethrough leaving a pair of relatively thin flexure arms 14 and 16 extending away from member 18 and link that member with an angularly downwardly extension 20 that terminates in a circuit contact point 22. The upper flexure arm 14 is provided with a metal stiffener strip 24. The electrically conductive element 26 extends from circuit contact point 22, along lower flexure arm 16, to the support end 28 at which end the electrically conductive element 26 has a wider or flared portion 30 for the purpose discussed below.

Figure 3:
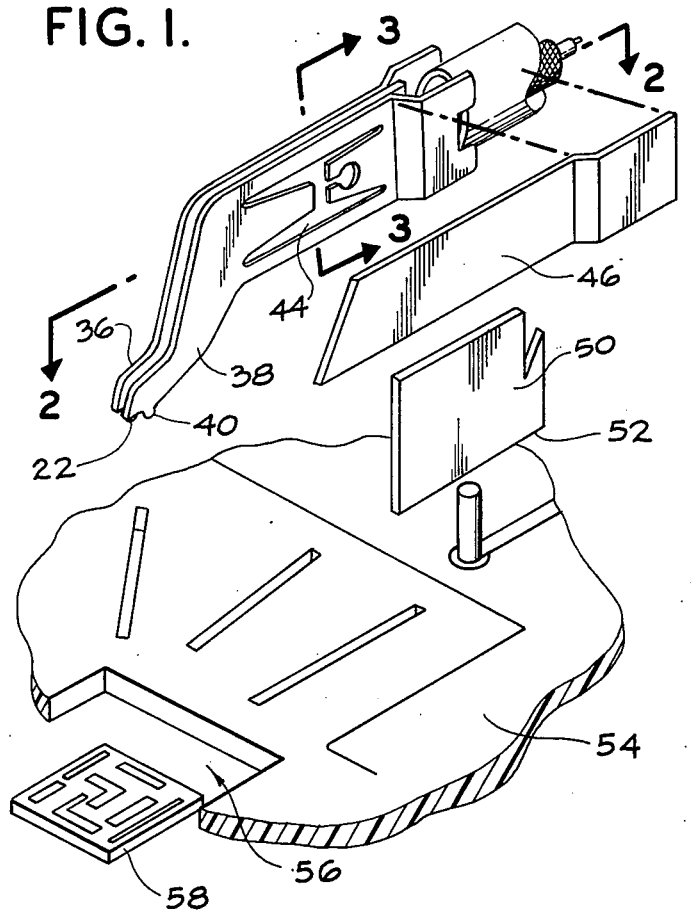
FIG. 3 is a section taken along the line 3—3 in FIG. 1.
Figure 2:
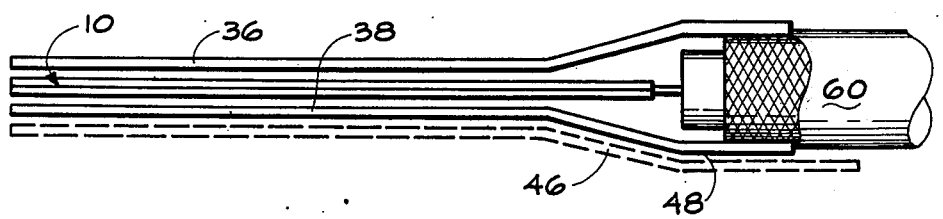
FIG. 2 is a section taken along the line 2—2 in FIG. 1.

As is shown in FIG. 3, the blade-like active body member 10 is laminated structure and it is prepared from a dielectric material, for example, from a layer 32 of Mylar (a commercial form of linear polyester polymeric material) coated or plated with an electrically conductive metal such as beryllium-copper. The layer is masked and etched by known procedures to form the configuration of the electrically conductive element 26, as shown in the drawings. Using another etchant, this one for the Mylar, the Mylar is then selectively removed to yield the opening 12 and the general overall shape of body member 10. A second or separate sheet or layer 34 of Mylar or other electrically insulating plastic is then masked and treated with an etchant to form therein a female groove precisely coincident with the configuration of the electrically conductive element 26. The two sheets 32 and 34 of Mylar are pressed together so that the electrically conductive element 26 is received in the female groove, and the plastic is then fused by heating to elevated temperature. The result is the blade-like active body member 10 wherein the electrically conductive element 26 is effectively encapsulated in the plastic insulating material. The printed circuit structure described above can also be replaced by a layer of beryllium-copper alloy.

The ground probes 36 and 38 are positioned on each side of the active body member 10. The ground probes 36 and 38 are made of beryllium-copper alloy or other similar conductive material which is familiar to those skilled in the art. Each of the ground probes 36 and 38 has a contact point 40 near the end of an angularly downwardly extension 42 where the device is to be used at levels above 50 megahertz. It is to be understood that far lower frequencies the contact points 40 can be omitted. Each of the ground probes 36 and 38 also has a cut-out or opening 44 therethrough.

The high frequency probe of this invention can be mounted for use in a number of ways. One illustrative way of mounting the probe is shown in exploded view in FIG. 1. The mounting clip 46 is joined to the ground contact 38 with solder at point 48. The mounting clip 46 is adapted to be received on insulator 50 having a metalized lower edge 52 and which edge is soldered to plate 54. The steel solder plate 54 contains an opening 56 therein through which the contact points 22 and 40 extend to contact the points to be tested on "chip" or circuit 58. Other mounting techniques are for example, as shown in U.S. Pat. No. 3,560,907 by providing an annular, insulative body having a prescribed number of transverse slots on one major surface. The high frequency probes are received within corresponding slots of an insulative body. The inner ends of the probes are pointed and extend through the annulus opening for contacting specific points of the circuit to which connection is made.

The coaxial cable 60 has inner and outer conductive elements, one of which serves the active body member 10 and the other serves the ground contacts 36 and 38. The coaxial cable 60 interconnects external testing equipment, for example (not shown) to the probe contacts. In operation, the probe 10 is brought into predetermined relation with a microminiature circuit 58 such that each probe contacts 22 and 40 resiliently and contactingly engages a prescribed point in the circuit, thereby permitting the conducting of tests or measuring circuit response by the external equipment.

A fixture locates the probe and circuit and confines motion of the probe with respect to the circuit to one of ninety degrees to the major circuit surface.

When the microminiature circuit 58 is brought into operative engagement with the probe 10 of the invention, the contact points 22 and 40 frictionally abut against predetermined regions of the circuit. In so doing, the extensions 20 and 42 are raised away from the surface 54 and the linking members are thereby stressed such that the contact points 22 and 40 are resiliently urged against the circuit 58 insuring good electrical connection. Also, as a result of the cantilever construction represented by the linking members, motion of the contacts points 22 and 40 during connection and disconnection is substantially at 90° to the upper plane surface of the circuit 58. This translation of the contacts along a line normal to the circuit surface is important and advantageous in that "scrubbing" motion of the contact points against circuit elements, i.e., across or transversely of the circuit is kept optimally small, which would tend to abrade the circuit elements either deteriorating circuit performance of possibly destroying portions of the circuit or leave the surface rough which causes failure of wire bonds in subsequent operations.

Obviously, the novel high frequency probe can be mounted or held for use in a variety of ways such as by magnets. This invention is not limited to any particular mounting configuration or to any particular mode of carrying the high frequency probe on a mounting.

An important feature of our invention is that the provision of the ground probes 36 and 38 on each side of the active body member 10 provides a uniform impedance in the probe. This is due to the uniformity of spacing between the ground probes 36 and 38 and active body member 10. This uniformity of spacing is disrupted only by the physical size requirements of coaxial cable 60. In proximity to the coaxial cable 60, the uniformity of impedance is provided by the wider or flared protion 30 of the electrically conductive element 26.

The desired impedance is dependent on the height of the ground probes being large relative to the space between the ground probe and the active body. In the presently preferred embodiment, the height of the ground probe is at least about five times the space between the ground probe and the active body and plus the thickness of the circuit on said active body.

Having fully described the invention it is intended that it be limited only by the lawful scope of the appended claims.

We claim:

1. A novel high frequency electrical probe comprising:
    a blade-like active body member adapted to be supported at one end with its major plane at substantially 90° to a circuit to which contact is to be made;
    the other end of said body member formed to have a generally pointed edge to serve as a contact point to be abutted against the circuit;
    on both sides of said active body member, ground contacts which are approximately coextensive with said body member, but having pointed edges which abut said circuit at points slightly displaced from the contact point of said active body member.

2. The novel high frequency probe of claim 1 wherein said probe has a uniform impedance.

3. The novel high frequency probe of claim 1 wherein the central regions of said blade-like member and ground contacts have areas of the member material removed forming said member into a double cantilever such that pressure of the pointed end against the circuit produces translation of said pointed end substantially 90° to the circuit.

4. The novel high frequency probe of claim 1 wherein the blade-like active body member is a thin layer of plastic carrying an electrical circuit in the form of a conductive metal deposit embedded therein.

5. The novel high frequency probe of claim 1 wherein said probe is carried on a mounting having an opening passing therethrough, and said contacts project through said opening into an underlying plane in which lays an exposed electrical circuit to be tested.

6. The novel high frequency probe of claim 1 wherein said ground contacts are beryllium copper.

7. A novel high frequency electrical probe comprising:
    a blade-like active body member having an electrically conductive region connected to a coaxial cable, adapted to be supported at one end with its major plane at substantially 90° to a circuit to which contact is to be made;

the other end of said body member formed to have a generally pointed edge coinciding with an edge of said electrically conductive region to serve as a contact point to be abutted against the circuit;

on both sides of said active body member, ground contacts which are approximately coextensive with said body member, but having pointed edges which abut said circuit at points slightly displaced from the contact point of said active body member;

said active body member including a flared portion in said conductive region adjacent said coaxial cable to provide uniformity of impedance.

* * * * *